United States Patent [19]
Yoshida et al.

[11] Patent Number: 5,065,697
[45] Date of Patent: Nov. 19, 1991

[54] LASER SPUTTERING APPARATUS

[75] Inventors: Yoshikazu Yoshida, Izumi; Kunio Tanaka, Toyonaka; Yukio Nishikawa, Ikeda, all of Japan

[73] Assignee: Matsushita Electric Industrial Co., Ltd., Osaka, Japan

[21] Appl. No.: 559,270

[22] Filed: Jul. 27, 1990

[30] Foreign Application Priority Data

Jul. 28, 1989 [JP] Japan ............................. 1-197747

[51] Int. Cl.$^5$ ........................................ C23C 16/48
[52] U.S. Cl. ..................... 118/719; 118/715; 118/720; 118/722; 118/724; 118/726; 118/727; 427/53.1
[58] Field of Search ............... 118/715, 719, 720, 722, 118/724, 726, 727; 427/53.1

[56] References Cited
U.S. PATENT DOCUMENTS 4,588,674  5/1986  Stewart ........................... 430/273
4,604,294  8/1986  Tanaka ........................... 427/53.1

FOREIGN PATENT DOCUMENTS 2113336  9/1971  Fed. Rep. of Germany.

OTHER PUBLICATIONS

Gutfeld, IBM Tech. Dis. Bul., vol. 17, No. 6, Nov. 1974, p. 1807.

Primary Examiner—Richard Bueker
Attorney, Agent, or Firm—Wenderoth, Lind & Ponack

[57] ABSTRACT

A laser sputtering apparatus includes a vacuum chamber, a laser for radiating a laser beam, a vacuum sealing window arranged at the chamber for introducing the beam into the chamber, a film transporting device for transporting a film while the film is passing near the window and a substrate holder arranged opposite to the window with the film therebetween for holding a substrate. The film has high laser transmission and a surface over which material for a thin film to be formed on the substrate is deposited. The device transports the film while the surface of the film is opposed to the substrate. The laser beam sputters the material on the thin film onto the substrate.

4 Claims, 4 Drawing Sheets

LASER SPUTTERING APPARATUS

BACKGROUND OF THE INVENTION

The present invention relates to a laser sputtering apparatus for depositing a thin film on a substrate for a thin film device.

There has been known this kind of a sputtering apparatus as disclosed in S. Komura et al., Japanese Journal of Applied Physics, vol. 27, 1988, page L23, which construction is shown in FIG. 6.

In the apparatus, in a vacuum chamber 21 capable of holding a vacuum by a gas discharging system 29 for creating a vacuum, a target 22 and a substrate holder 23 are arranged opposite to each other. A substrate 24 is held on the holder 23. Reference numeral 25 denotes a Q-Switched, YAG laser for visible radiations. A laser beam 26 with the second order harmonics, which has a wavelength of 532 nm, is condensed by an optical system 27 to be emitted onto the target 22 through a vacuum sealing window 28 arranged at the chamber 21, thus depositing a thin film on the substrate 24 by sputtering of the material of the target 22.

According to the above-described apparatus, however, the thin film is deposited a slow speed, and the sputtering substance from the target 22 becomes attached to the window 28, and thus the sputtering substance prevents the laser beam 26 from being transmitted through the window 28.

Also there are problems in that oxides and impurities easily contaminate into the target 22, previously manufactured in another process. In a case where the target 22 is made of an alloy or a compound, a thin film of a specified composition of the compound is not certainly formed because all of the component element is not uniformly sputtered. In comparison, there has been proposed a sputtering apparatus in which plural kinds of targets are arranged in parallel and laser beams are radiated to the targets to sputter in correspondence with the composition of each compound. However, the composition differs in accordance with the position on the substrate.

SUMMARY OF THE INVENTION

Accordingly, an essential object of the present invention is to provide a laser sputtering apparatus capable improving the sputter rate, preventing the sputtering substance from adhering on a vacuum sealing window, preventing oxides and impurities from contaminating a thin film, and easily and certainly forming a thin film of a material such as an alloy or a compound.

In accomplishing these and other objects, according to one aspect of the present invention, there is provided a laser sputtering apparatus comprising a vacuum chamber, a laser for radiating a laser beam, a vacuum sealing window arranged at the chamber for introducing the beam into the chamber, a film transport for transporting a film while the film is passing near the window, the film having high laser transmission characteristics and a surface over which material for a thin film to be formed on a substrate is deposited, the surface thereof opposing the substrate, and a substrate holder arranged opposite to the window through the film for holding the substrate.

By the above construction in one aspect of the present invention, a laser beam radiating from a laser transmitted through the vacuum sealing window and the film to sputter the deposited material on the film. Then the material is adhered to the substrate on the substrate holder opposite to the film, and simultaneously the laser beam transmitted, through the film with evaporation of the depositing material is radiated onto the surface of the substrate so that the surface is activated to improve the sputter rate. The material deposited over the surface, of the film opposite the substrate, which is on the opposite side of the film relative to the window, is sputtered, towards the substrate, so that the sputtering material has difficulty in adhering to the window.

According to another aspect of the present invention, there is provided a laser sputtering apparatus wherein plural kinds of materials are deposited, laminate over the surface of the film.

By the construction according to this aspect of the present invention, different sputtering materials are deposited laminated on the film, and thus these materials can be simultaneously and certainly sputtered to form a thin film of an alloy or compound of uniform composition.

According to a still another aspect of the present invention, there is provided a laser sputtering apparatus further comprising an evaporation source, arranged in the chamber, for evaporating material to be deposited onto the film and deposit the evaporated material on the film.

By the construction according to this aspect of the present invention, the deposition of the depositing material and the sputtering of the material are performed in the same vacuum chamber, thus reducing the amount of contamination due to oxides and impurities of the thin film to improve the quality of the thin film.

According to a further aspect of the present invention, there is provided a laser sputtering apparatus further comprising a partition separating the chamber into a depositing chamber for depositing the material on the film and a sputtering chamber for sputtering after the beam is radiated on the material deposited on the film, the film passing through the partition. A gas exhaust is arranged in each of the depositing chamber and the sputtering chamber for exhausting a gas in each chamber. A gas source for providing a reactive gas into the sputtering chamber is also provided.

By the construction according to the further aspects of the above present invention, the depositing chamber and the sputtering chamber are separated by the partition, and reactive gas is introduced into the sputtering chamber to control the gas pressure of each of the depositing chamber and the sputtering chamber, thus performing a reactive laser sputtering.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE EMBODIMENTS

Figure 1:
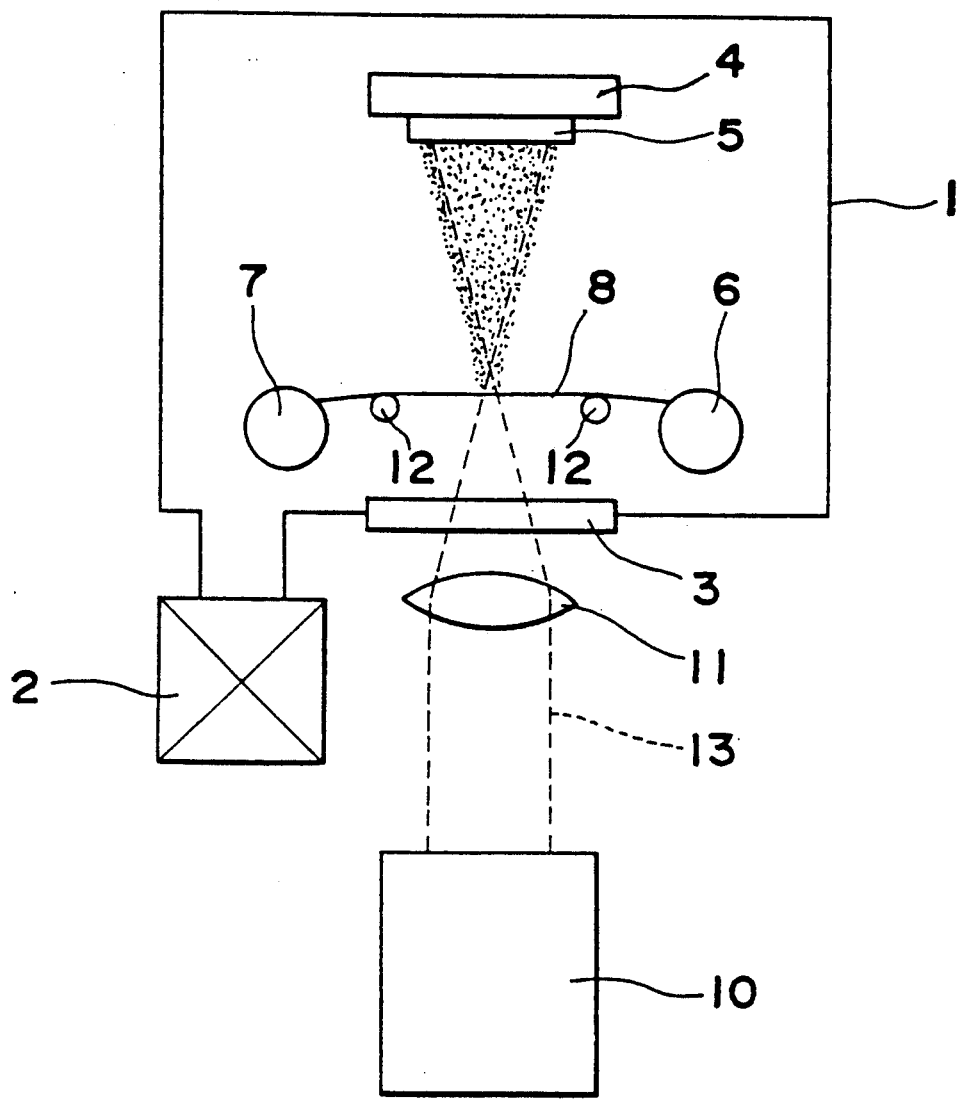
FIG. 1 is a schematic view showing the construction of a laser sputtering apparatus according to a first embodiment of the present invention.
Figure 2:
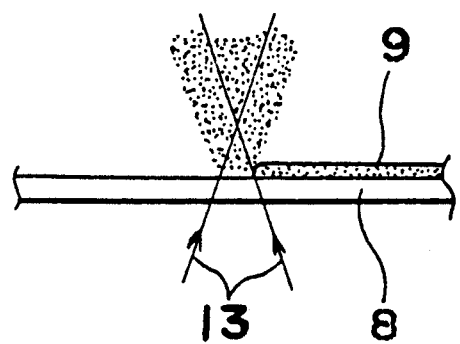
FIG. 2 is an enlarged cross-sectional view of a laser beam radiating portion of a film.

Before the description of the present invention proceeds, it is to be noted that like parts are designated by like reference numerals throughout the accompanying drawings FIGS. 1 and 2 show a laser sputtering apparatus according to the first embodiment of the present invention. Reference numeral 1 denotes a vacuum chamber constructed to be capable of holding a specified vacuum pressure of about $10^{-2}$ to $10^{-3}$ Torr by a gas exhaust system 2. At the lower wall of the vacuum chamber 1, a vacuum sealing window 3 is arranged to introduce a laser beam into the chamber 1. On the opposite side to the window 3 in the chamber 1, that is, at the upper wall of the chamber 1, a substrate holder 4 is arranged opposite to the window 3 to hold a substrate 5 thereon on which a thin film will be found. On both sides of a position between the window 3 and holder 4, a rewinding reel 6 and a winding reel 7 are arranged. Then, as fully shown in FIG. 2, a film 8 on which a depositing layer 9 of a thin film material is formed is transported from the rewinding reel 6 to pass near the window 3 to be wound by the winding reel 7 in the chamber 1. The film 8 is constructed to have high laser transmission, and the depositing layer 9 is formed over the surface of the film 8 which opposes to the substrate 5.

Reference numeral 10 denotes a laser such as a Kr F excimer laser having a wavelength of 249 nm and constructed to radiate a pulse laser beam with 17 nsec pulse duration and 10 Hz repeat frequency. The pulse laser beam radiated from the laser 10 is condensed through an optical system 11 to be radiated on the depositing layer 9 after transmission through the window 3 and the film 8, and then the laser beam transmitted to the film 8 is radiated onto the substrate 5 after the depositing layer 9 is sputtered by the laser beam. Reference numeral 12 denotes a guide roller arranged at a position opposed to each side of the inside of the window 3 to regulate the transporting position of the film 8.

According to the construction of the apparatus, a pulse laser beam 13 radiated from the laser 10 is condensed through the optical system 11 and then is transmitted through the window 3 to radiate onto the film 8. As shown in FIG. 2, since the film 8 has high laser transmission, the laser beam 13 is transmitted through the film 8 without change so as to be intensively radiated onto the depositing layer 9 of thin film material so that the material is sputtered towards the substrate 5. Thus, the material is adhered onto the surface of the substrate 5 and the depositing layer 9 is simultaneously sputtered, so that the laser beam 13 transmitted through the film 8 is radiated onto the surface of the substrate 5. Then the surface of the substrate 5 is activated to improve the sputter rate to form a thin film with a high quality thereon.

According to the first embodiment, the laser beam 13 radiated from the laser 10 is transmitted through the window 3 and the film 8 to sputter the depositing material on the film 8 and thus the material is adhered on the substrate 5 held on the holder 4 opposite to the window 3. At the same time, the laser beam transmitted through the film 8 by evaporation of the depositing material is radiated on the surface of the substrate 5, so that the surface of the substrate 5 is activated to improve the sputter rate, resulting in the improvement of the quality of the thin film. Since the material 13 deposited over a surface opposite to the surface of the film 8 opposed to the window 3 and is sputtered towards the substrate 5, the sputtering material has difficulty in adhering to the window 3, thus stably radiating the laser beam on the film 8 for a long time.

Figure 3:
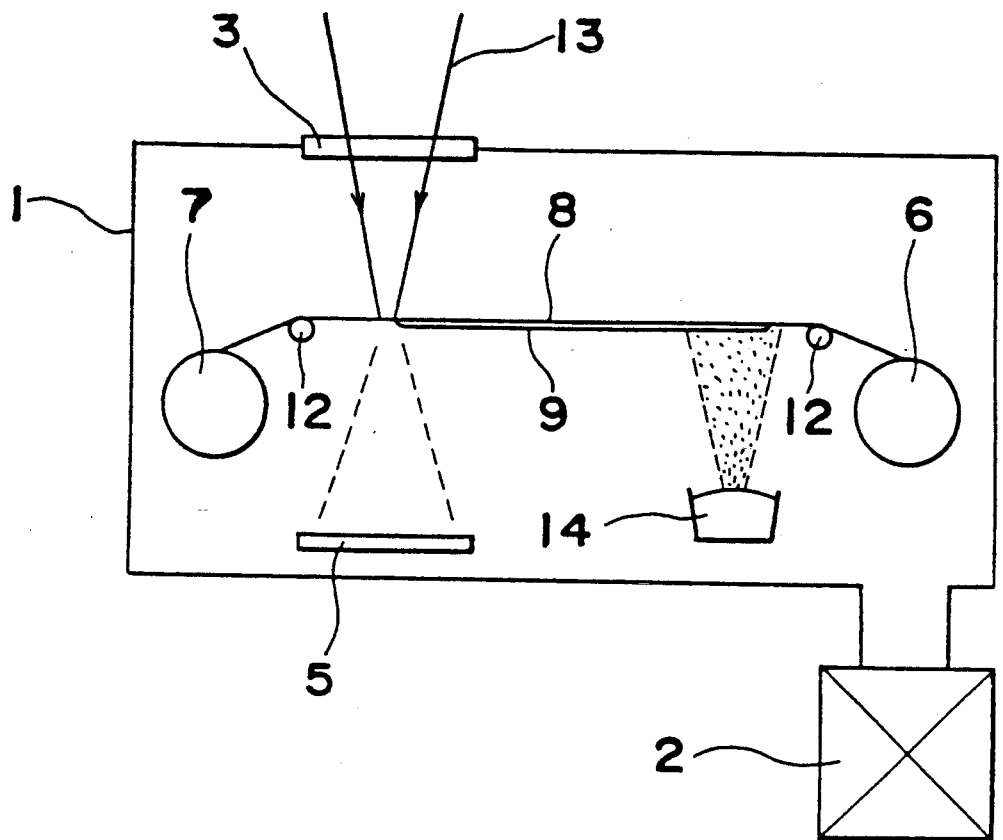
FIG. 3 is a schematic view showing the construction of a laser sputtering apparatus according to a second embodiment of the present invention.

Although the depositing layer 9 of the thin film material is previously formed on the film 8 in the first embodiment, as shown in the second embodiment in FIG. 3, deposition can be performed on the film 8 in the chamber 1.

In FIG. 3, the chamber 1 is oblong to form a larger space between the rewinding reel 6 and a pulse laser beam radiating portion and has an evaporation source 14 for the thin film material arranged at a position near the rewinding reel 6. The evaporation source 14 accommodates the thin film material in its container and has a suitable heating means for heating the material.

In the second embodiment, the film 8 without the depositing layer 9 is transported from the rewinding reel 6 toward the winding reel 7, and the thin film material is deposited over the film 8 at a position opposite to the evaporation source 14 to form the depositing layer 9. Thereafter, similarly to the first embodiment, the depositing layer 9 is sputtered by the laser beam 13 to form a thin film on the substrate 5. In this manner, the deposition and sputtering is performed in the same chamber 1, thus reducing the amount of contamination by oxides and impurities to the thin film formed on the substrate 5.

Figure 4:
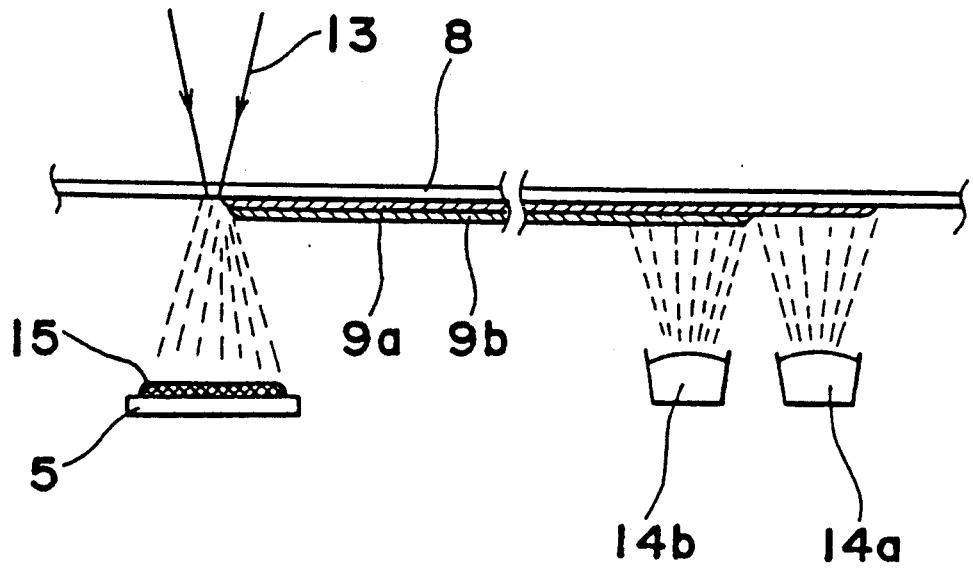
FIG. 4 is a schematic view showing the construction of a laser sputtering apparatus according to a third embodiment of the present invention.

The depositing layer 9, of simple composition, is formed on the film 8, and then a thin film of the same composition is formed on the substrate 5 in the second embodiment. Alternatively, in a laser sputtering apparatus according to the third embodiment in which the depositing layer 9 over the film 8 serves as a target, the following sputtering can be performed, as shown in FIG. 4. That is, a first depositing layer 9a depositing a first composition of the thin film material and a second depositing layer 9b depositing a second composition thereof are laminated over the film 8 and sputtering is performed utilizing the film 8, thus forming on the substrate 5 a thin film of an alloy or compound of these compositions. For example, when the first depositing layer 9a is made of nickel and the second depositing layer 9b is made of aluminum, a thin film 15 of nickel-aluminum alloy can be stably formed on the substrate 5.

It is preferable to arrange a first evaporation source 14a accommodating the first composition and a second evaporation source 14b accommodating the second composition along the transporting path of the film 8 in order to form the first depositing layer 9a and the second depositing layer 9b. The formation of the depositing layers 9a and 9b can be performed in the chamber 1 for sputtering or another vacuum chamber.

According to the third embodiment, when different sputtering materials are deposited laminating over the film 8, these materials can be simultaneously and certainly sputtered to form a thin film of alloy or compound of uniform composition.

Figure 5:
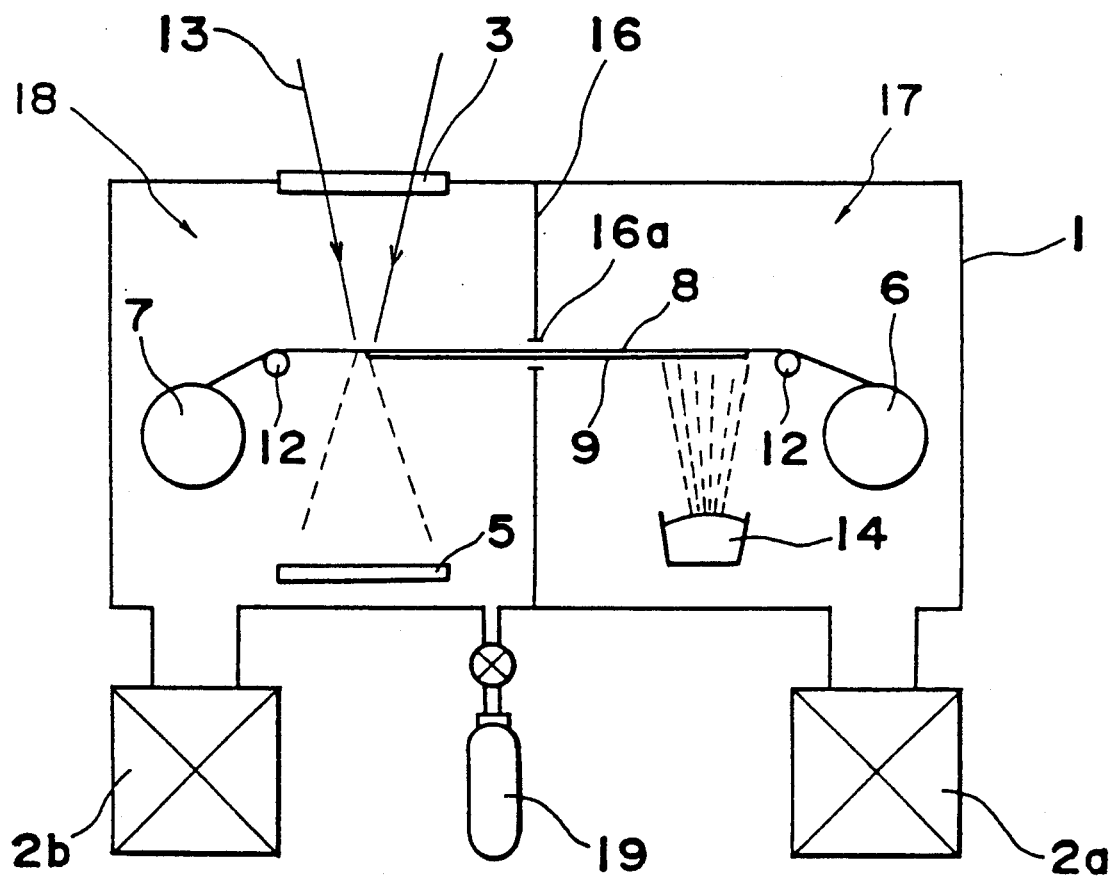
FIG. 5 is a schematic view showing the construction of a laser sputtering apparatus according to a fourth embodiment of the present invention.
Figure 6:
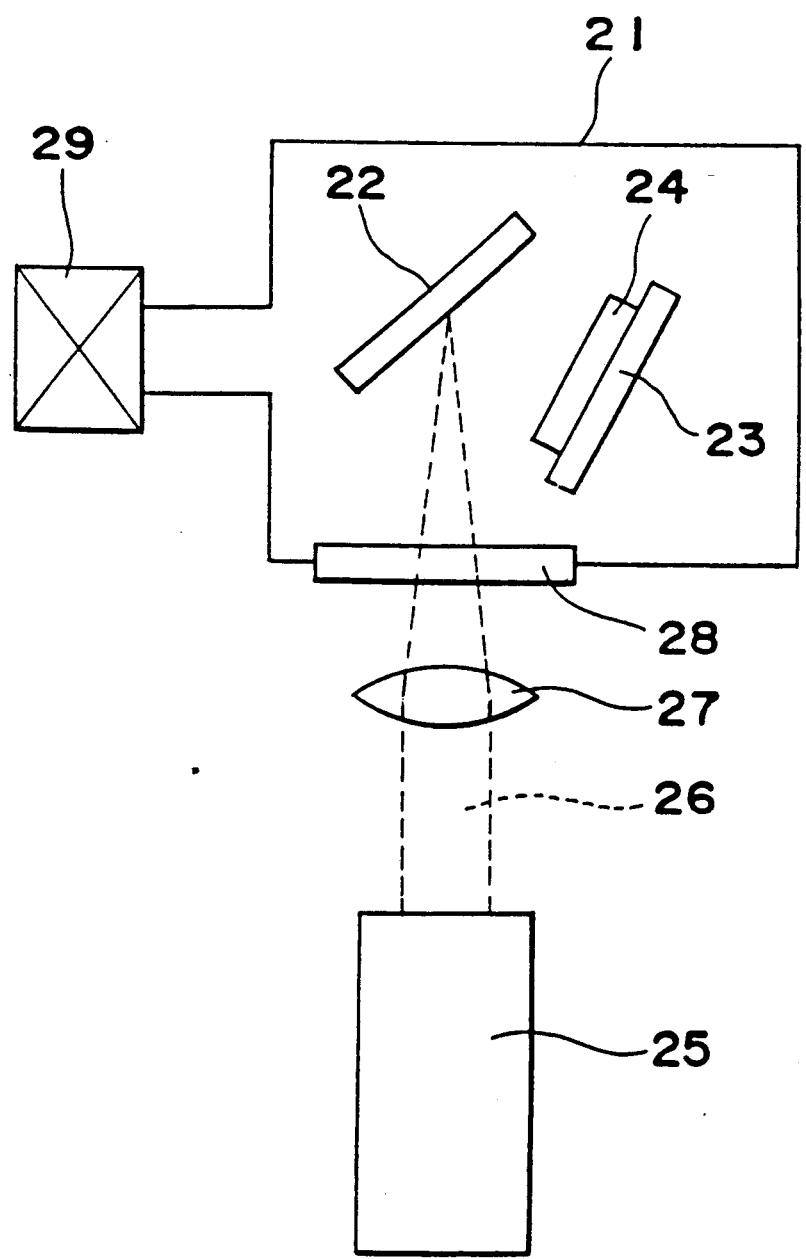
FIG. 6 is a schematic view showing a known laser sputtering apparatus.

Additionally, in a case where the deposition and the reactive laser sputtering are performed in the same vacuum chamber 1, as with the fourth embodiment shown in FIG. 5, the chamber 1 is divided by a partition 16 into a depositing chamber 17 and a sputtering chamber 18, and gas exhaust systems 2a and 2b for generating a vacuum are respectively arranged at the depositing chamber 17 and the sputtering chamber 18 to control the degree of vacuum thereof. At the sputtering chamber 18 is arranged a reactive gas introducing source 19. The partition 16 has a through hole 16a for passing the film 8 therethrough.

In this embodiment, the pressure in the depositing chamber 17 is set to be $10^{-5}$–$10^{-6}$ Torr and the depositing layer 9 is formed on the film 8 with the material evaporated from the evaporation source 14. The film 8 over which the depositing layer 9 is formed passes through the hole 16a of the partition 16 to enter the sputtering chamber 18. The sputtering chamber 18 is full of reactive gas introduced by the reactive gas introducing source 19, and the pressure in the sputtering chamber 18 is set to be $10^{-2}$–$10^{-4}$ Torr. In this state, a pulse laser beam 13 transmitted through the window 3 is radiated on the film 8 to perform reactive laser sputtering.

According to the fourth embodiment, the stable deposition of the depositing material and the reactive laser sputtering of the material can be performed in the same vacuum chamber, thus reducing the amount of contamination oxides and impurities to the thin film to improve the quality of the thin film. The depositing chamber 17 and the sputtering chamber 18 are separated by the partition 16, and reactive gas is introduced into the sputtering chamber 18 to control the gas pressure of each of the depositing chamber 17 and the sputtering chamber 18, thus performing the reactive laser sputtering.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A laser sputtering apparatus, comprising:
   a vacuum chamber;
   a laser for radiating a laser beam;
   a vacuum sealing window disposed in said chamber for transmitting the laser beam from said laser into said chamber;
   a film transporting means for transporting a film in said chamber such that said film passes by said window, said film having a high laser transmission characteristic and a surface over which a material to be sputtered onto a substrate is deposited, said surface being directed toward a position of the substrate;
   a substrate holder arranged in said vacuum chamber facing said film and said window for holding the substrate; and
   an evaporation device arranged in said vacuum chamber for evaporating and depositing the material to be sputtered onto said film inside said vacuum chamber.

2. The laser sputtering apparatus of claim 1, wherein:
   a partition is provided in said vacuum chamber dividing said chamber into a depositing chamber wherein said evaporation device is disposed for depositing the material on said film and a sputtering chamber wherein said substrate holder and said vacuum sealing window are disposed for sputtering the material on said film onto the substrate with the laser beam of said laser, said film having the material thereon passing through said partition;
   a gas exhaust means connected to each of said depositing chamber and said sputtering chamber for exhausting the gas therefrom to generate a vacuum therein; and
   a reactive gas supply means for supplying a reactive gas to said sputtering chamber.

3. The sputtering apparatus of claim 1, wherein said film transporting means has a winding reel in said sputtering chamber for winding the film and an unwinding reel in said depositing chamber for unwinding the film.

4. The sputtering apparatus of claim 1, wherein an additional said evaporation device is arranged in said vacuum chamber for evaporating and depositing a second material to be sputtered onto the film inside said vacuum chamber, whereby alloys and compounds of the two materials can be formed by sputtering on the substrate.

* * * * *